US009564570B2

(12) United States Patent
Limbeck et al.

(10) Patent No.: US 9,564,570 B2
(45) Date of Patent: Feb. 7, 2017

(54) THERMOELECTRIC MODULE WITH THERMAL EXPANSION COMPENSATION, METHOD FOR PRODUCING A THERMOELECTRIC MODULE AND THERMOELECTRIC GENERATOR (71) Applicant: EMITEC GESELLSCHAFT FUER EMISSIONSTECHNOLOGIE MBH, Lohmar (DE)

(72) Inventors: Sigrid Limbeck, Much (DE); Rolf Brueck, Bergisch Gladbach (DE)

(73) Assignee: EMITEC Gesellschaft fuer Emissionstechnologie mbH, Lohmar (DE)

(*) Notice: Subject to any disclaimer, the term of this patent is extended or adjusted under 35 U.S.C. 154(b) by 162 days.

(21) Appl. No.: 13/940,664

(22) Filed: Jul. 12, 2013

(65) Prior Publication Data
US 2013/0298955 A1 Nov. 14, 2013

Related U.S. Application Data (63) Continuation of application No. PCT/EP2012/050106, filed on Jan. 4, 2012.

(30) Foreign Application Priority Data

Jan. 12, 2011 (DE) .................. 10 2011 008 378

(51) Int. Cl.
H01L 35/00 (2006.01)
H01L 35/32 (2006.01)
(Continued)

(52) U.S. Cl.
CPC ............... H01L 35/32 (2013.01); H01L 35/34 (2013.01); F01N 5/025 (2013.01)

(58) Field of Classification Search
CPC .......... H01L 35/00; H01L 35/30; H01L 35/32; H01L 35/34
See application file for complete search history.

(56) References Cited

U.S. PATENT DOCUMENTS 3,057,939 A 10/1962 Fritts
3,269,872 A * 8/1966 Thompson ................. 136/208
(Continued)

FOREIGN PATENT DOCUMENTS

CN 1744338 A 3/2006
CN 101043064 A 9/2007
(Continued)

OTHER PUBLICATIONS

International Search Report of PCT/EP2012/050106, Dated Jul. 11, 2012.

Primary Examiner — Matthew Martin
(74) Attorney, Agent, or Firm — Laurence A. Greenberg; Werner H. Stemer; Ralph E. Locher (57) ABSTRACT A thermoelectric module extends in a longitudinal direction and includes an outer tube, an inner tube disposed within the outer tube and an interspace between the tubes. At least one first strip-shaped structure and one second strip-shaped structure are provided. The first strip-shaped structure extends from a first connection on the inner tube and the second strip-shaped structure extends from a second connection on the outer tube in opposite directions in at least one circumferential direction or in the longitudinal direction and at least partly form an overlap at least in the circumferential direction or in the longitudinal direction. At least one pair of semiconductor elements is disposed in the region of the overlap. A method for producing a thermoelectric module and a thermoelectric generator are also provided.

12 Claims, 5 Drawing Sheets (51) Int. Cl.
*H01L 35/34* (2006.01)
*F01N 5/02* (2006.01)

(56) References Cited

U.S. PATENT DOCUMENTS

| | | |
|---|---|---|
| 6,548,750 B1 | 4/2003 | Picone |
| 7,467,513 B2 | 12/2008 | Sasaki et al. |
| 8,646,310 B2 | 2/2014 | Takahashi et al. |
| 9,184,365 B2 | 11/2015 | Limbeck et al. |
| 2006/0042675 A1 | 3/2006 | Tateyama et al. |
| 2006/0042676 A1* | 3/2006 | Sogou et al. ................ 136/212 |
| 2006/0162854 A1 | 7/2006 | Althofer |
| 2007/0221264 A1 | 9/2007 | Shutoh et al. |
| 2008/0017238 A1 | 1/2008 | Fei et al. |
| 2009/0133734 A1 | 5/2009 | Takahashi |
| 2010/0116307 A1* | 5/2010 | Hagg et al. ................ 136/205 |
| 2011/0155202 A1* | 6/2011 | Arnold et al. ................ 136/224 |
| 2011/0258995 A1 | 10/2011 | Limbeck et al. |
| 2011/0314798 A1 | 12/2011 | Limbeck et al. |
| 2012/0118344 A1 | 5/2012 | Schluck et al. |

FOREIGN PATENT DOCUMENTS

| | | |
|---|---|---|
| DE | 60030694 T2 | 9/2007 |
| DE | 102009009586 A1 | 8/2010 |
| DE | 102009003144 A1 | 11/2010 |
| FR | 1198118 A | 12/1959 |
| JP | H02151087 A | 6/1990 |
| JP | H07307493 A | 11/1995 |
| JP | 2001060725 A | 3/2001 |
| JP | 2008091539 A | 4/2008 |
| JP | 2009295752 A | 12/2009 |
| RU | 51287 U1 | 1/2006 |
| SU | 1179045 A1 | 9/1985 |
| WO | 8805964 A1 | 8/1988 |
| WO | 2005021198 A1 | 3/2005 |
| WO | 2010094533 A2 | 8/2010 |
| WO | 2012049790 A1 | 4/2012 |

* cited by examiner

THERMOELECTRIC MODULE WITH THERMAL EXPANSION COMPENSATION, METHOD FOR PRODUCING A THERMOELECTRIC MODULE AND THERMOELECTRIC GENERATOR

CROSS-REFERENCE TO RELATED APPLICATION

This is a continuation application, under 35 U.S.C. §120, of copending International Application No. PCT/EP2012/050106, filed Jan. 4, 2012, which designated the United States; this application also claims the priority, under 35 U.S.C. §119, of German Patent Application DE 10 2011 008 378.2, filed Jan. 12, 2011; the prior applications are herewith incorporated by reference in their entirety.

BACKGROUND OF THE INVENTION

Field of the Invention

The present invention relates to a thermoelectric module with a tubular configuration, a method for the production thereof and a thermoelectric generator suitable for converting thermal energy of an exhaust gas into electric energy. The thermoelectric module is used to construct the thermoelectric generator.

The exhaust gas from an engine of a motor vehicle contains thermal energy, which can be converted into electric energy by using a thermoelectric generator in order, for example, to charge a battery or some other energy storage device or to feed the required energy directly to electric loads. In that way, the motor vehicle is operated with an improved energy efficiency, and more energy is available for the operation of the motor vehicle.

A thermoelectric generator of that kind has at least one thermoelectric module, with a plurality of such modules (of similar construction) generally being electrically interconnected in such a way that they jointly form a thermoelectric generator. Thermoelectric materials which are used for that purpose are of such a type that they can convert thermal energy effectively into electric energy (Seebeck effect) and vice versa (Peltier effect). Thermoelectric modules of that kind preferably have a multiplicity of thermoelectric elements, which are positioned between a "hot side" and a "cold side." Thermoelectric elements include, for example, at least two semiconductor elements, which are p-doped and n-doped and together form the smallest thermoelectric unit. Those semiconductor elements are provided alternately on the top and bottom side thereof (respectively facing the hot side and the cold side) with electrically conductive bridges, with the result that respective n-doped and p-doped semiconductor elements are connected to one another. Normally, those electrically conductive bridges are electrically insulated from a housing which accommodates the thermoelectric elements. If a temperature gradient is provided on both sides of the semiconductor elements, a voltage potential is formed between the ends of the semiconductor elements. The charge carriers on the hotter side are excited to an increased extent into the conduction band by the higher temperature. Due to the difference in concentration which arises in the conduction band in that process, charge carriers diffuse to the colder side of the semiconductor element, giving rise to the potential difference. In a thermoelectric module, semiconductor elements, in particular a large number of semiconductor elements, are connected electrically in series. In order to ensure that the generated potential difference of the serial semiconductor elements does not even itself out, semiconductor elements with different majority charge carriers (n-doped and p-doped) are always brought alternately into direct electric contact. The circuit can be closed by using a connected load resistor, and thus electric power can be taken off.

In order to use tubular thermoelectric modules in motor vehicles, in particular, semiconductor elements which are disposed one behind the other in a circular ring between an inner tube and an outer tube are suitable, in which an exhaust gas or a hot medium flows over the inner tube or the outer tube. As a consequence of the temperature potential applied across the thermoelectric module, the thermoelectric module is subjected to differences in thermal expansion of individual components. In order to provide a durable thermoelectric module, it is necessary to compensate for those differences in thermal expansion within the thermoelectric module or within a thermoelectric generator.

SUMMARY OF THE INVENTION

It is accordingly an object of the invention to provide a thermoelectric module with thermal expansion compensation, a method for producing a thermoelectric module and a thermoelectric generator, which overcome the hereinafore-mentioned disadvantages and at least partially solve the highlighted problems of the heretofore-known modules, methods and generators of this general type. In particular, the intention is to indicate a tubular thermoelectric module which can compensate for differences in thermal expansion of individual components of the thermoelectric module and thus achieve a high durability of the thermoelectric module, even during operation. This is intended to enable the production of a temperature-stable and durable thermoelectric module.

With the foregoing and other objects in view there is provided, in accordance with the invention, a thermoelectric module extending in a longitudinal direction and comprising an outer tube, an inner tube disposed within the outer tube and an interspace disposed therebetween. In addition, at least one first strip-shaped structure and one second strip-shaped structure are provided. The first strip-shaped structure, which starts from a first connection to the inner tube, and the second strip-shaped structure, which starts from a second connection to the outer tube, extend in mutually opposite directions in at least one circumferential direction or the longitudinal direction, and form an at least partial overlap, at least in the circumferential direction or in the longitudinal direction. At least one semiconductor element or one pair of semiconductor elements is disposed in the region of this overlap.

In this case, the module is, in particular, embodied in the manner of a double tube, wherein the outer tube and the inner tube are disposed concentrically with respect to one another and the annular gap between them serves as an interspace in which the thermoelectric elements are provided. The tube shape is preferably substantially cylindrical, but this is not absolutely necessary. Thus, it is also possible, in particular, to employ rectangular or square tube shapes and, in some cases, these may even give better results in terms of stress minimization and/or accuracy of production. It is unimportant in this case, in particular, whether the "hot side" is disposed on the outer tube or the inner tube.

In particular, the first and/or second strip-shaped structures are formed by sheet-metal strips, which form a length between two ends, a width between two sides and a thickness between two surfaces. The overlap between the strip-shaped structures relates to at least part of the length and part of the width of the respective pairs under consideration including a first and a second strip-shaped structure. One end of the second strip-shaped structures is connected to the outer tube while, in turn, one end of the first strip-shaped structures is connected to the inner tube. In this case, the first and/or second connection is preferably embodied as a material bond (in particular by using a weld or by a brazed or soldered joint). A materially bonded joint is present when the partners in the joint are held together by atomic and/or molecular forces. The other end of the strip-shaped structures in each case projects into the interspace. In particular, the strip-shaped structures extend for this purpose at least partially in the longitudinal direction and/or in the circumferential direction of the tubes and furthermore, if appropriate, also in the radial direction toward the opposite tube. In this configuration, at least one pair including a first and a second strip-shaped structure (at least partially) overlaps. This region of the overlap is then used to position semiconductor elements therebetween, which are consequently in thermally conductive contact with the hot side, on one hand, and with the cold side, on the other hand, by using the strip-shaped structures.

The semiconductor elements are disposed on the surface of the strip-shaped structures and, in particular, are built up directly on the strip-shaped structures, e.g. by a printing method. In particular, this buildup of the semiconductor elements on the strip-shaped structures takes place in layers, thus making it possible to configure semiconductor elements with different properties with respect to temperature stability, heat conduction or the like for the respective application and point of installation. In particular, the semiconductor elements, which are disposed in the region of the overlap, have a cuboidal, cylindrical and/or circular-ring-segment-shaped construction. One of the following methods can be employed, in particular, as a printing method for applying the semiconductor elements: drop on demand, continuous inkjet, bubble jet. These methods are also known, inter alia, from the technical context of the application of a layer for brazing or soldering metal honeycomb bodies (see, for example, International Publication No. WO 2005/021198 A1, corresponding to U.S. Patent Application Publication No. 2006/0162854, which is incorporated herein in full as an example to illustrate the methods). These methods can likewise also be employed for applying semiconductor material to the strip-shaped structures mentioned herein. In particular, the strip-shaped structures are made available as an endless material, allowing the semiconductor materials to be applied in an economical and high-productivity production method. It is only afterwards that the strip-shaped structures are cut to the required dimensions, or by using a corresponding separation method.

In order to be able to electrically interconnect n-doped and p-doped semiconductor elements in alternation in an appropriate manner, thus producing a thermoelectric element, electrically conductive bridges or electric conductor structures, in particular, are disposed on the strip-shaped structures. The strip-shaped structures are preferably metallic and have an electric insulation which insulates the electric conductor structures from the strip-shaped structures. In particular, just one thermoelectric element is disposed on each pair including a first and a second strip-shaped structure, thus enabling the thermoelectric elements on the individual pairs of strip-shaped structures likewise to be interconnected in parallel or in series with one another. It is, of course, also possible to place just a single semiconductor element on each pair of strip-shaped structures, with the result that a thermoelectric element is formed only by electrical interconnection with another pair of strip-shaped structures. In particular, the strip-shaped structures have a width such that a multiplicity of thermoelectric elements can be disposed one behind the other in the direction of the width and can be connected electrically in series with one another. In this case, the semiconductor elements which are combined to form a thermoelectric element, of which there are in each case two, are preferably disposed adjacent one another in the direction of the length. In particular, more than one thermoelectric element is disposed adjacent one another and so as to be connected in series or in parallel in the direction of the length of the strip-shaped structure, thus ensuring a high degree of space utilization of the interspace between the outer tube and the inner tube by the thermoelectric elements.

The strip-shaped structures connected to one another by semiconductor elements accordingly form a kind of connecting bridge for the two tubes. This connecting bridge is then capable of converting the expansion of at least one tube into a movement of a tube or of compensating for the expansion of at least one tube in such a way that a movement of at least one tube does not result in impairment of the functioning of the thermoelectric module due, for example, to damage to the semiconductor elements disposed between the tubes or to the electric conductor structures thereof. In this case, the connecting bridges are preferably embodied in such a way that thermal expansions are compensated for not only by using the components in the interspace but are at least partially also converted into a movement of the inner tube relative to the outer tube. In other words, the thermal expansion of the individual components of the thermoelectric module is, if required, compensated for by the fact that that expansion is fully absorbed or compensated for by the strip-shaped structures and/or the fact that at least the outer tube and the inner tube can move relative to one another and this movement is compensated for by the components in the interspace (i.e. strip-shaped structures, semiconductor elements, etc.) in such a way that stresses are relieved and damage to the components of the thermoelectric module does not occur. The orientation or alignment of the strip-shaped structures in the longitudinal direction thus allows an axial displacement and/or the orientation or alignment of the strip-shaped structures in the circumferential direction allows twisting of the tubes relative to one another, for example, because the lengthwise expansion of the strips or the expansion of at least one tube leads to a corresponding relative movement or allows this movement (thereby relieving stresses within the thermoelectric module). It should be noted herein that the stresses in the central region including the semiconductor elements can then be kept to a particularly low level during operation, despite the alternating thermal stress.

Even though complex (that is to say, in particular, joint and/or simultaneous) compensating movements between the outer tube, the inner tube and the components in the interspace have been described above, the compensating movement can be performed primarily or even (substantially) exclusively by the components in the interspace.

In accordance with another feature of the invention, the outer tube and the inner tube are disposed in such a way relative to one another that a thermal expansion of the thermoelectric module is compensated for by a movement of the outer tube relative to the inner tube. In particular, this includes a situation where the entire inner tube moves relative to the outer tube or vice versa, i.e. where, in particular, the outer tube is not rigidly fixed relative to the inner tube at any point in terms of its positioning.

In this case, the outer tube and the inner tube are (directly or indirectly) connected to one another and/or supported in such a way relative to one another that, overall, they can move relative to one another when they expand and/or shrink due to temperature stresses. This means, in particular, that a shift in the position of the inner tube and the outer tube is made possible, thereby ensuring minimization of shear stress between these tubes.

A thermal expansion of the individual components (outer tube, inner tube, semiconductor elements, etc.) of the tubular module may therefore additionally cause a (relative) movement in a circumferential direction (that is to say, for example, involving twisting or rotation relative to one another) and/or in a longitudinal direction (that is to say, for example, involving an axial displacement relative to one another) and/or in a radial direction of the thermoelectric module. This means, in particular, that at least one of the elements, namely the inner tube or the outer tube, performs a movement when subjected to a thermal stress or, in particular, that both move relative to one another. Through the use of this (relative) movement, thermal stresses within the thermoelectric module are also relieved, with the result, in particular, that the usually very brittle semiconductor elements are not damaged and thus a durable thermoelectric module is produced.

This concept of tubes which are capable of movement relative to one another can also be implemented independently of the configuration of the module with the strip-shaped structures and the pair of semiconductor elements in the region of overlap, and therefore the objects mentioned at the outset are also achieved (independently thereof) by the thermoelectric module described below:

A tubular thermoelectric module which extends in a longitudinal direction, having an outer tube, an inner tube disposed within the outer tube, and an interspace disposed therebetween, wherein the outer tube and the inner tube are disposed in such a way relative to one another that a thermal expansion of the module is compensated for by a movement of the outer tube relative to the inner tube.

Reference may be made in full to the preceding and following descriptions thereof for an explanation of this fundamental concept.

Another embodiment of the thermoelectric module according to the invention includes the thermoelectric module extending in a longitudinal direction and having an outer tube, an inner tube disposed within the outer tube, and an interspace disposed therebetween. The outer tube and the inner tube are disposed in such a way relative to one another that a thermal expansion of the module is compensated for by components disposed in the interspace. In particular, the thermoelectric elements disposed in the interspace should be disposed in such a way that the movement of the tubes relative to one another caused by the difference in thermal expansion does not lead to damage to the components disposed in the interspace. Preferably, therefore, the movement of the outer tube relative to the inner tube is compensated for exclusively by the components of the thermoelectric module which are disposed in the interspace. Due to the inherent temperature difference, there are differential expansions of the inner tube and the outer tube, and these should also be permitted as far as possible with a view to minimizing stress. The configuration then resides in placing the stress-sensitive semiconductor elements situated therebetween in such a way (alone and/or on appropriately embodied "supports" or strip-shaped structures) that they accompany the relative movement of the two tubes as well as possible (with the minimum possible stress). The components concerned include, in particular, at least the semiconductor elements and/or appropriately embodied supports or strip-shaped structures, on which the semiconductor elements are disposed.

Preferably, it is precisely not by using structural measures on the outer tube or the inner tube (e.g. folds or the like) that compensation of the difference in thermal expansion is ensured, but exclusively by using a movement of the outer tube relative to the inner tube and/or by using an appropriate configuration or compensating movement of the components disposed in the interspace.

In accordance with a further particularly preferred feature of the thermoelectric module of the invention, the first connection and the second connection are disposed obliquely relative to the circumferential direction and/or obliquely relative to the longitudinal direction of the thermoelectric module. With such an orientation or alignment of the connections, a longer length of the strip-shaped structures can be connected to the inner tube and the outer tube by using a joining process (e.g. hard or soft soldering or welding), thereby making it possible to reduce the outlay on production. This applies especially when as few as possible strip-shaped structures are to be used and a high level of utilization of space by the semiconductor elements in the interspace is nevertheless to be achieved.

In accordance with an added particularly preferred feature of the thermoelectric module of the invention, the first connections extend in a helical shape on the inner tube and the second connections extend in a helical shape on the outer tube. A very particularly preferred option in this case is one in which all of the first strip-shaped structures are secured (in particular welded, brazed or soldered) on the inner tube by using a single helical first connection and/or all of the second strip-shaped structures are secured (in particular welded, brazed or soldered) on the outer tube by using a single helical second connection.

Due to the configuration of the semiconductor elements on the strip-shaped structures which are disposed in the interspace between the outer tube and the inner tube, a thermal expansion of the thermoelectric module in at least one radial direction can be absorbed resiliently by using the strip-shaped structures. An expansion in the longitudinal direction of the thermoelectric module by one of the components, namely the outer tube or the inner tube, or by both tubes relative to one another, can be compensated for either by a configuration of the strip-shaped structures wherein the ends thereof each face in the longitudinal direction or by an oblique configuration of the strip-shaped structures relative to the longitudinal direction, in which case, however, only part of the difference in thermal expansion in the longitudinal direction is compensated for. The other part of the thermal expansion to be compensated for is then absorbed in the radial direction and/or in the circumferential direction of the thermoelectric module. In the compensation of these differences in thermal expansion, the inner tube is moved relative to the outer tube. It is likewise possible for the movement to occur by reason of the respectively occurring thermal expansion of the inner tube and the outer tube, and the strip-shaped structures connecting them or the semiconductor elements giving way in corresponding fashion. The strip-shaped structures can compensate resiliently for a thermal stress in the radial direction. However, a thermal expansion in the circumferential direction or in the longitudinal direction of the thermoelectric module, which simultaneously means a shear stress with respect to the semiconductor elements, is dissipated by the movement of the inner tube relative to the outer tube and by corresponding tilting of the strip-shaped structures. For this reason, at least one component of the group including the outer tube or the inner tube can be embodied so as to be movable, thus allowing movement of the inner tube relative to the outer tube.

In this movable configuration of the inner tube and/or of the outer tube of the thermoelectric module, attention must be paid, in particular, to the connections of the inner tube and/or of the outer tube within a thermoelectric generator, wherein the leak-tightness, in particular, of the interspace but also the leak-tightness of the hot side relative to the cold side, should be maintained. For this reason, a sliding fit for the inner tube and/or the outer tube on the respective tube end should be provided, in particular, allowing it to move by a slight amount relative to a mount or a housing of a thermoelectric generator without compromising the leak-tightness of the thermoelectric module itself or the leak-tightness of the hot side relative to the cold side.

In accordance with an additional particularly advantageous feature of the thermoelectric module of the invention, a plurality of first strip-shaped structures and a plurality of second strip-shaped structures are disposed at least in the circumferential direction or in the longitudinal direction of the thermoelectric module. In particular, it is proposed that in each case at least six (6) pairs of first and second strip-shaped structures should be disposed one behind the other in the circumferential direction, in particular extending helically, i.e. in the longitudinal direction and in the circumferential direction of the thermoelectric module, through the entire thermoelectric module and thus accommodating a multiplicity of semiconductor elements between the respective first strip-shaped structure and the respective second strip-shaped structure. In particular, more than 20, especially more than 50 and, as a particularly advantageous option, more than 100, thermoelectric elements are thus disposed per pair. This multiplicity of thermoelectric elements can be applied by using a printing method, for example, to strip-shaped structures, in particular endless strip-shaped structures, which are cut off after being printed with at least the semiconductor materials to give appropriate first and/or second strip-shaped structures of the desired length and width.

Even if it is preferred that the inner tube and/or the outer tube is a separate component, it is not absolutely necessary. Thus, such an inner tube/outer tube can also be formed (partially) by the strip-shaped structures themselves, e.g. by embodying the strip-shaped structures in such a way that they are wound up to form a stable tube in an end region. An end region of the strip-shaped structures then at least partially forms the respective tube and the other end region of the strip-shaped structures forms the overlap with the semiconductor elements. In particular, a plurality of strip-shaped structures is disposed adjacent one another and wound into a spiral, thus forming an inner tube or outer tube with appropriate overlaps for the semiconductor elements.

The interspace between the inner tube and the outer tube is filled, in particular, by air, a vacuum or an inert gas atmosphere, thus allowing unrestricted thermal expansion of the individual components in the radial direction, in the longitudinal direction and in the circumferential direction but also resilient movement of the strip-shaped structures in the radial direction. Air, a vacuum or an inert gas atmosphere simultaneously ensures electric insulation between the semiconductor elements and good thermal insulation between the hot side and the cold side.

The degree of filling of the interspace with semiconductor elements is preferably in a range of from 20% to 80%, in particular in a range of from 20% to 40%. In this case, the degree of filling of the interspace refers to the volume between the inner tube and the outer tube that could theoretically be completely filled by semiconductor material without the strip-shaped structures. Accordingly, an interspace completely filled by semiconductor material between the inner tube and the outer tube would have a degree of filling of 100%.

With the objects of the invention in view, there is also provided a method for producing a thermoelectric module, comprising at least the following steps:

a) provision of at least one first strip-shaped structure and one second strip-shaped structure, b) application of an electrically conductive conductor structure to at least the first strip-shaped structure or the second strip-shaped structure, c) application of semiconductor elements to the conductor structure of at least one strip-shaped structure, and d) configuration of the at least one first strip-shaped structure and of the at least one second strip-shaped structure to form in each case one pair, wherein the first strip-shaped structure and the second strip-shaped structure form an overlap in one region, with the result that the semiconductor elements are in each case connected to the strip-shaped structures by the electric conductor structure, and a flow of current can be produced along each pair including a first strip-shaped structure and a second strip-shaped structure.

In particular, the strip-shaped structures are connected by a material bond to an inner tube and/or an outer tube only after step d), e.g. by a welding method, a brazing or soldering method and/or an adhesive bond, thus producing a thermoelectric module.

It should also be noted that an electric insulation layer should additionally be applied before step b) is carried out, especially where the strip-shaped structures are metallic, to ensure that electric decoupling of the metallic structures from the conducting structure is ensured.

In accordance with another particularly advantageous mode of the invention, at least the inner tube or the outer tube is formed at least partially by the strip-shaped structures in step d) or after step d). This means, in particular, that no further tube element is added to the inner tube and/or to the outer tube but that the inner tube and/or the outer tube are formed exclusively by the strip-shaped structures. If appropriate, it is possible, in particular, for tube end regions to be provided which already have a special embodiment, with the result that they have a sliding fit or slide-type fit relative to a housing of a thermoelectric generator and can thus accommodate the relative movement of the inner tube or of the outer tube within the thermoelectric module and can ensure leak-tightness relative to other components.

In accordance with a further mode of the method of the invention, which is simple in terms of production technology, the application of semiconductor elements is accomplished by using a printing method. During this process, the strip-shaped structures can, for example, be fed continuously to a printer which rapidly and reliably applies the thermoelectric material there at the desired positions. If required, it is also possible in this way to produce a conductor structure in advance and/or in parallel.

With the objects of the invention in view, there is concomitantly provided a thermoelectric generator, comprising a plurality of thermoelectric modules according to the invention or thermoelectric modules produced by the methods according to the invention, which are interconnected electrically. In particular, a thermoelectric module is disposed in a housing or in a thermoelectric generator in such a way that at least the cold side of the thermoelectric module is disposed in a spatially fixed manner by using its respective ends. In particular, one end of the hot side is furthermore spatially fixed, with the result that a movement of the inner tube relative to the outer tube is obtained only by an expansion of the tube disposed on the hot side. In particular, at least the hot side and, if appropriate, also the cold side does not have any further compensation features for dissipating thermal expansions, e.g. folds in the tube or the like.

The invention is used particularly in a motor vehicle. In this case, there is a flow of exhaust gas from the engine of the motor vehicle around the hot side of the thermoelectric generator, while the cold side is, for example, formed with a water circuit.

Other features which are considered as characteristic for the invention are set forth in the appended claims, noting that the features presented individually in the claims can be combined in any technologically meaningful way and give rise to additional embodiments of the invention.

Although the invention is illustrated and described herein as embodied in a thermoelectric module with thermal expansion compensation, a method for producing a thermoelectric module and a thermoelectric generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings. The description, especially in conjunction with the figures, explains the invention further and presents supplementary embodiments of the invention.

DETAILED DESCRIPTION OF THE INVENTION

Figure 1:
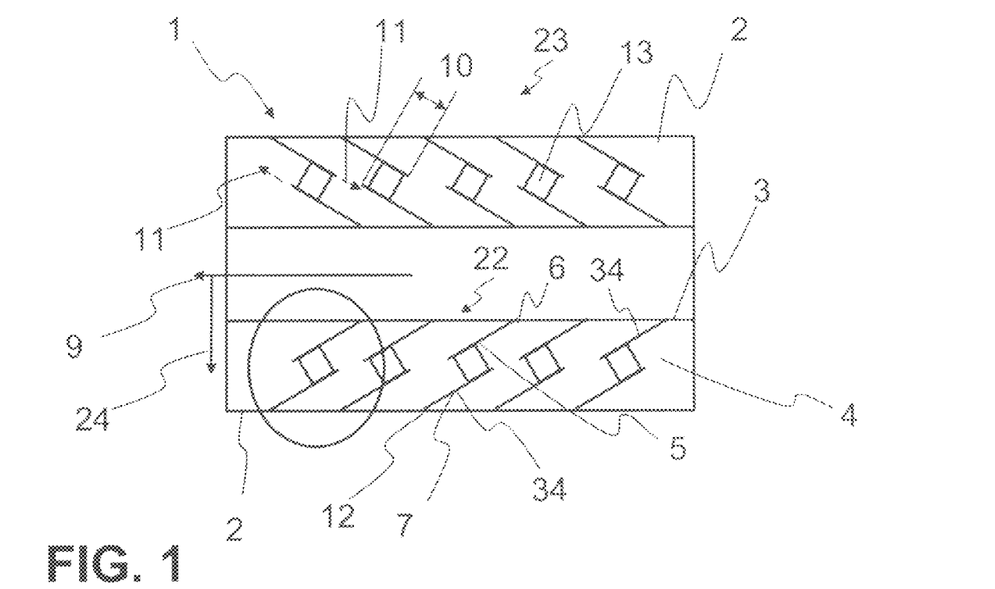
FIG. 1 is a diagrammatic, longitudinal-sectional view of a tubular thermoelectric module.

Referring now to the figures of the drawings in detail and first, particularly, to FIG. 1 thereof, there is seen a thermoelectric module 1 which has an outer tube 2 and an inner tube 3 that extend in a longitudinal direction 9. In this case, the inner tube 3 is connected to a hot side 22 (e.g. an exhaust gas flow from an internal combustion engine), and the outer tube 2 is connected to a cold side 23. First strip-shaped structures 5 and second strip-shaped structures 7 are disposed in an interspace 4 formed between the outer tube 2 and the inner tube 3. The first strip-shaped structures 5 are connected to the inner tube 3 by a first connection 6 which extends in the circumferential direction. The first strip-shaped structures 5 extend in the longitudinal direction 9, in a radial direction 24 and in a direction 11 from the first connection 6. The second strip-shaped structures 7 are connected to the outer tube 2 by a second connection 12 and extend from the second connection 12 in an opposite direction 11 toward the first strip-shaped structures 5. An overlap 10, within which semiconductor elements 13 connected to the first strip-shaped structures 5 and the second strip-shaped structures 7 are disposed, is formed between a pair of structures including the first strip-shaped structure 5 and the second strip-shaped structure 7.

Figure 2:
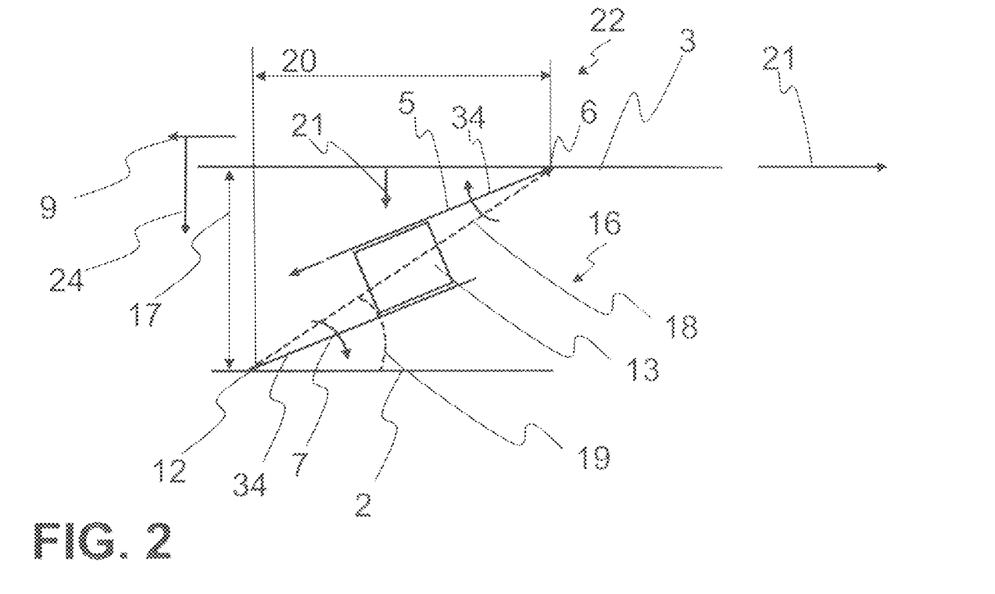
FIG. 2 is an enlarged, fragmentary, sectional view of a portion of FIG. 1.

FIG. 2 shows an enlarged portion of FIG. 1, which is intended to illustrate a compensation of thermal expansion. The first strip-shaped structure 5 is connected to the inner tube 3 by a first connection 6. Due to the configuration of the inner tube 3 on the hot side 22, expansion of the inner tube 3 takes place both in the longitudinal direction 9 and in the radial direction 24. This thermal expansion results in a movement 21 relative to the outer tube 2, which has to be compensated. The second strip-shaped structure 7 is connected to the outer tube 2 by a second connection 12 and forms an overlap 10 with the first strip-shaped structure 5, within which a semiconductor element 13 is disposed. The first strip-shaped structure 5 and the second strip-shaped structure 7 thus form a pair 16. The pair 16 has a segment height 17 which defines the distance in the radial direction 24 between the first connection 6 and the second connection 12. The pair 16 furthermore has a segment length 20, which defines a distance in the longitudinal direction 9 between the first connection 6 and the second connection 12. The pair 16 also has a diagonal angle 19, which is disposed between the outer tube 2 and a diagonal length 18 which connects the first connection 6 and the second connection 12, or is disposed between the inner tube 3 and the diagonal length 18.

The thermal expansions both in the longitudinal direction 9 and in the radial direction 24 are now compensated for by the relative movement 21 of the inner tube, thus making it possible to avoid a shear stress acting on the semiconductor elements 13. The movement 21 of the inner tube 3 in the longitudinal direction 9 and in the radial direction 24 leads to a change in the diagonal angle 19, which thus becomes smaller (see the direction of the arrow). The thermal expansion of the inner tube 3 in the radial direction 24 furthermore leads to a change in the diagonal length 18, and therefore shear stresses would be induced in the semiconductor element. This change in the diagonal length 18 is now compensated for by the relative movement 21 of the inner tube 3, which thus moves the first connection 6 away from the second connection 12. As a result, the diagonal length 18 remains constant, and a shear stress which could act on the semiconductor elements 13 is avoided. As a result of this combined possibility of compensation, on one hand through the possible movement 21 of the inner tube 3 relative to the outer tube 2 and, on the other hand, through the resilient configuration of the strip-shaped structures 5, 7, no shear stresses are transmitted to the semiconductor elements 13 and, as a result, they are not subject to any structural loading. The compensation effect is brought about, in particular, by the fact that the thermal expansion of the semiconductor elements on the strip-shaped structures (i.e. the diagonal) is matched to the thermal expansion of the surrounding area (i.e. the relative movement of the inner tube and the outer tube).

It is furthermore possible, through a specific selection of the parameters of the diagonal length 18 and the diagonal angle 19, to reduce the movement 21 of the inner tube 3 relative to the outer tube 2 in such a way that a change in length in the longitudinal direction 9 of the tube 2, 3 disposed on the hot side 22 takes place solely on the basis of the thermal expansion, and no additional relative movement 21 is required to compensate for the thermal expansion in the radial direction 24. A high temperature at one of the tubes 2, 3 brings about a thermal expansion in the radial direction 24 by a relative movement 21, which reduces the segment height 17, and furthermore a thermal expansion in the longitudinal direction 9 by a relative movement 21, which increases the segment length 20. These thermal expansions and the corresponding relative movements 21 also include, in particular, the additional thermal expansions of individual components 34, e.g. of the strip-shaped structures 5, 7 etc. Through appropriate initial magnitudes for the diagonal length 18 and the diagonal angle 19, it is now possible for the thermal expansions in the radial direction 24 and the longitudinal direction 9, which are known for a particular temperature range, to compensate for one another. This compensation is complete when the shortening of the diagonal length 18 due to the reduction in the segment height 17 is canceled out by the lengthening of the diagonal length 18 due to the increase in the segment length 20.

Figure 3:
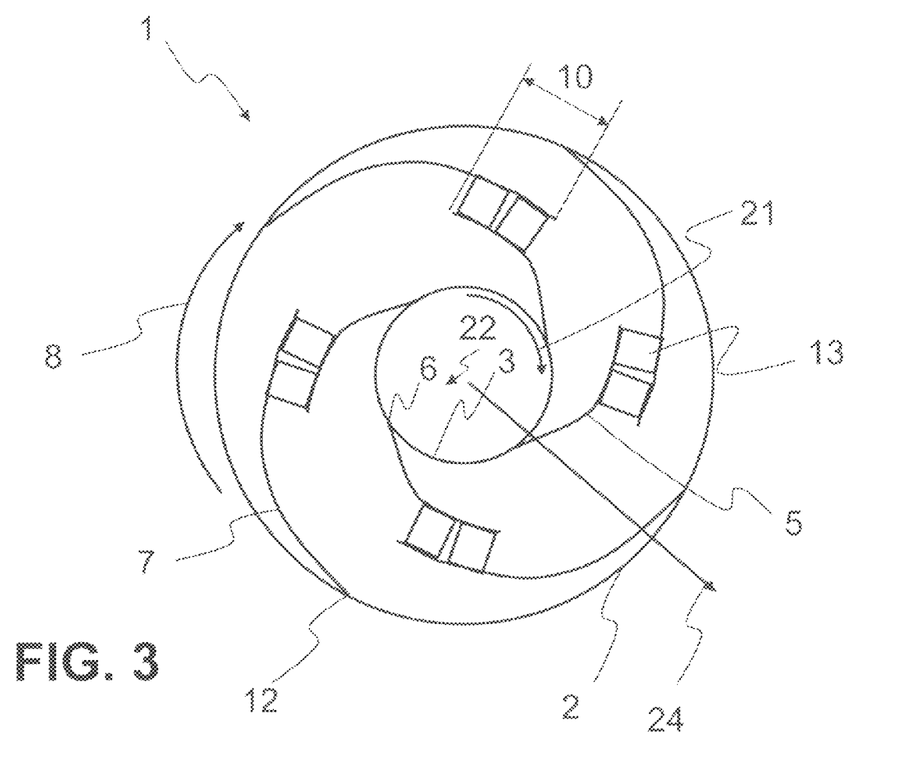
FIG. 3 is a cross-sectional view of another variant embodiment of a tubular thermoelectric module.

FIG. 3 shows another variant embodiment of a thermoelectric module 1, wherein the thermoelectric module 1 has a circular outer tube 2 and a circular inner tube 3 with first strip-shaped structures 5 and second strip-shaped structures 7 extending in the circumferential direction 8 and the radial direction 24. These first strip-shaped structures 5 and second strip-shaped structures 7 each form an overlap 10, within which two semiconductor elements 13, each forming a thermoelectric element, are disposed. An expansion in the radial direction 24 of the inner tube 3, which is connected to a hot side 22, is compensated for, on one hand, by an involute configuration of the strip-shaped structures 5, 7 and, if appropriate, it is additionally compensated for by a movement 21, in the circumferential direction 8, of the inner tube 3 relative to the outer tube 2. As a result, there is simultaneously a compensation of the expansion of the first strip-shaped structure 5 due to heating from the hot side 22. The definitions stated in relation to FIG. 2 can be transferred in corresponding fashion to the embodiment according to FIG. 3. The expansion of the inner tube 3 in the radial direction 24 on one hand reduces the segment height and hence also the diagonal length. In order to carry out the compensation, the relative movement 21 of the inner tube 3 takes place in the circumferential direction 8, with the result that the diagonal length is increased by a corresponding amount, and shear stresses, which can lead to destruction of the semiconductor elements 13, are prevented. Through an oblique configuration of the strip-shaped structures 5, 7 on the outer tube 2 and on the inner tube 3, respectively, it is furthermore possible to compensate for an expansion of the length of the inner tube 3 relative to the outer tube 2. This is ensured particularly in the case of a helical configuration of the strip-shaped structures 5, 7. In this case too, a specific selection of the parameters for the diagonal length and diagonal angle can be used to at least partially avoid an additional relative movement 21 of the inner tube 3, since the required movement 21 of the inner tube 3 in the circumferential direction 8 to increase the diagonal length can then be at least partially compensated for by a thermal expansion of the inner tube 3 in the longitudinal direction.

Figure 4:
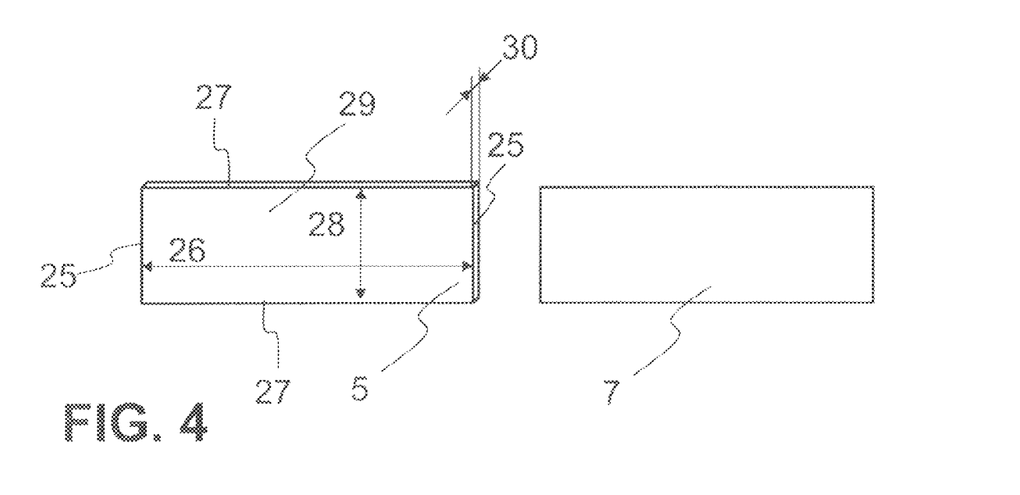
FIG. 4 is a plan view showing step a) of a method for producing a thermoelectric module.

FIG. 4 shows a method step a) for the production of a thermoelectric module 1, in which a first strip-shaped structure 5 and a second strip-shaped structure 7 are provided. The strip-shaped structures 5, 7 have a length 26 between two ends 25 and a width 28 between two sides 27. The strip-shaped structure is furthermore bounded by two surfaces 29, which are spaced apart from one another defining a thickness 30.

Figure 5:
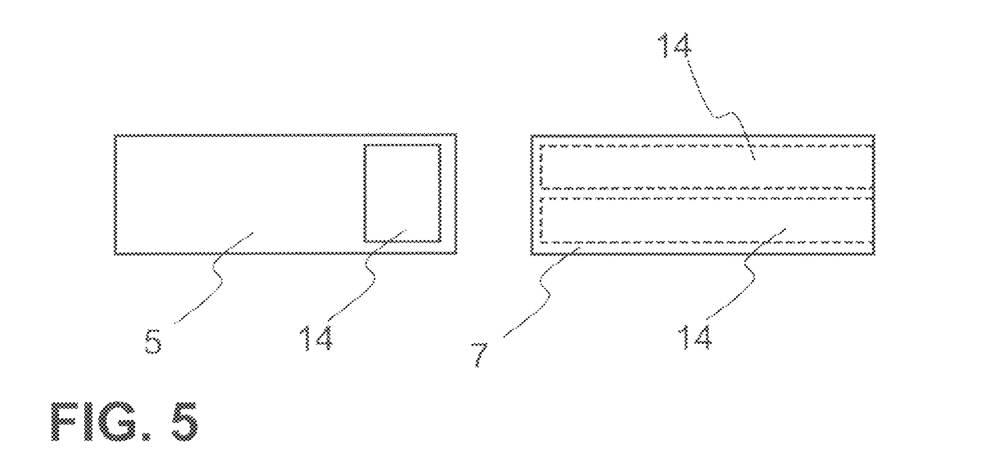
FIG. 5 is a plan view showing step b) of a method for producing a thermoelectric module.

FIG. 5 shows a method step b) for the production of a thermoelectric module 1, in which electrically conductive conductor structures 14 are applied to the first strip-shaped structure 5 and to the second strip-shaped structure 7. The conductor structures 14 shown in the right-hand part of the figure in dashed lines are disposed on the bottom surface of the second strip-shaped structure 7.

Figure 6:
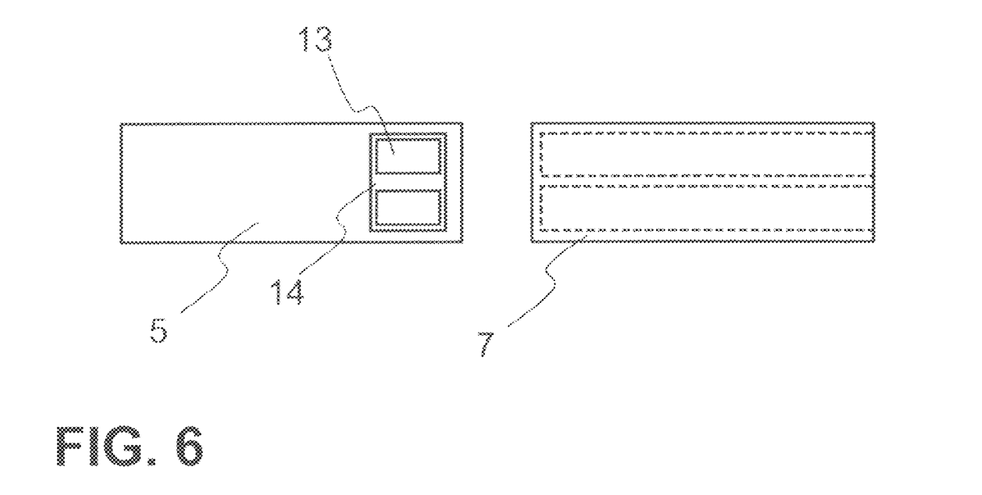
FIG. 6 is a plan view showing step c) of a method for producing a thermoelectric module.

FIG. 6 shows a method step c) for the production of a thermoelectric module 1, in which semiconductor elements 13 are applied to the conductor structure 14 of the first strip-shaped structure 5.

Figure 7:
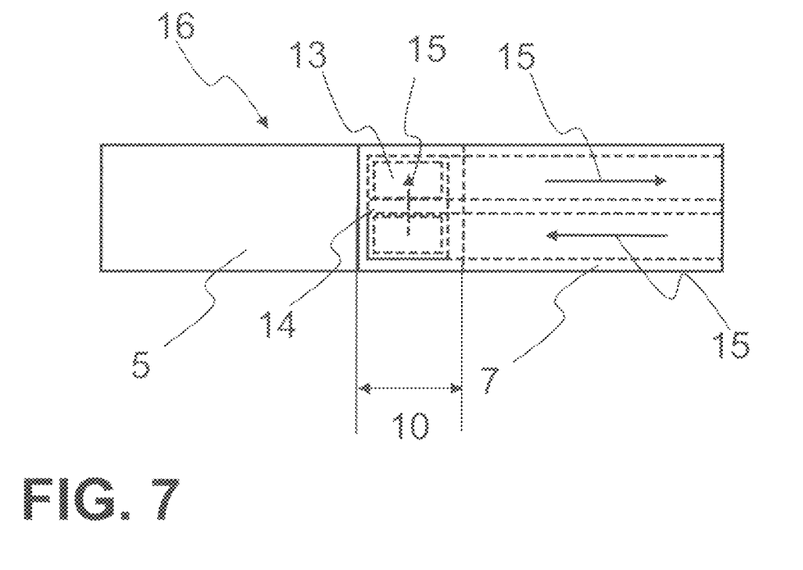
FIG. 7 is a plan view showing step d) of a method for producing a thermoelectric module.

FIG. 7 shows a method step d) for the production of a thermoelectric module 1, in which the first strip-shaped structure 5 and the second strip-shaped structure 7 are disposed to form a pair 16, forming an overlap 10, thus enabling semiconductor elements 13 to be disposed between the first strip-shaped structure 5 and the second strip-shaped structure 7 on the electrically conductive conductor structures 14. This pair 16 thus forms a thermoelectric element which is suitable for generating a flow of electric current 15 when a temperature potential is applied.

Figure 8:
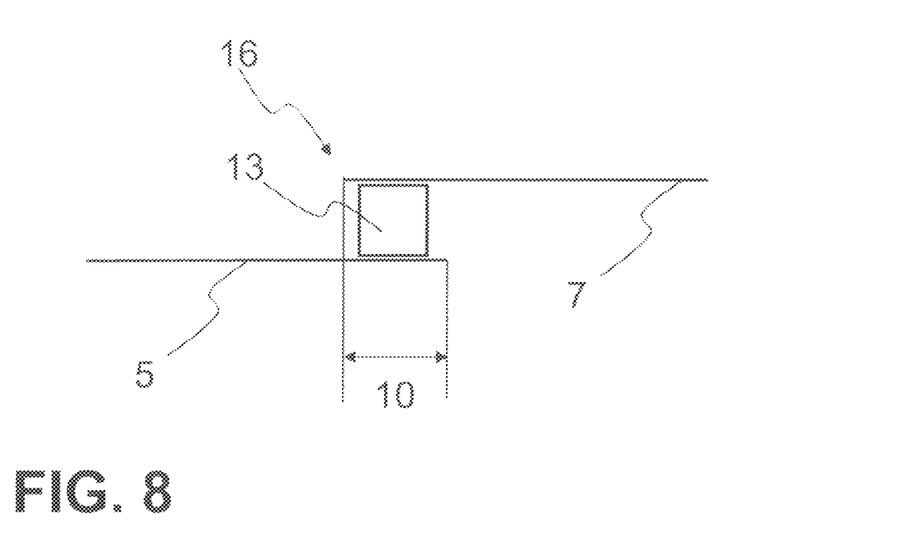
FIG. 8 is a plan view showing a configuration of a semiconductor element between strip-shaped structures.

FIG. 8 shows the configuration of a semiconductor element 13 between the strip-shaped structures 5, 7 which form a pair 16. The semiconductor element 13 is disposed in the region of the overlap 10.

Figure 9:
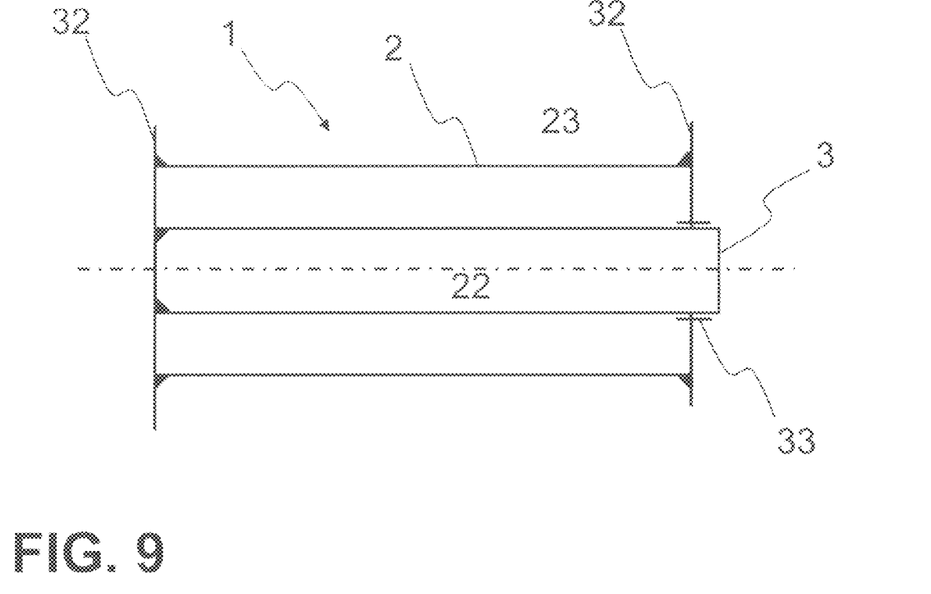
FIG. 9 is a plan view showing a configuration of a thermoelectric module between two mounts.

FIG. 9 shows the configuration of a thermoelectric module 1 between two mounts 32. The inner tube 3 is connected to a hot side 22, and the outer tube 2 is connected to a cold side 23. The inner tube 3 is accordingly embodied with a sliding fit 33 in one mount 32, allowing a movement 21 of the inner tube 3 relative to the outer tube 2.

Figure 10:
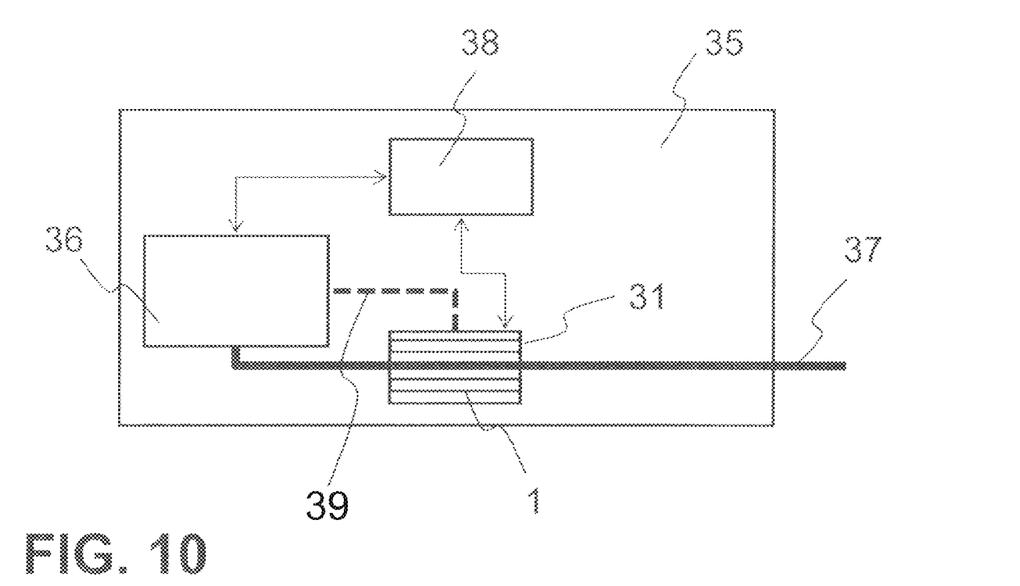
FIG. 10 is a block diagram of a motor vehicle having a thermoelectric generator.

FIG. 10 is intended to illustrate the preferred use of the invention in a motor vehicle 35. In this case, the motor vehicle 35 has an internal combustion engine 36 or some other heat source. The hot exhaust gas produced in the internal combustion engine 36 is passed through an exhaust line 37, in which it also flows through a thermoelectric generator 31 including a plurality of (tubular) thermoelectric modules 1. The thermoelectric generator 31 is furthermore connected to a cooling line 39 (e.g. a water-filled engine cooling circuit), and therefore a hot side of the thermoelectric generator 31 can be supplied with a flow of exhaust gas and a cold side thereof can be supplied with a flow of coolant. This can be set up and/or monitored with a monitoring unit 38, thus enabling the thermoelectric generator 31 to be operated from there, if appropriate by using feedback regarding the operation of the exhaust system and/or of the internal combustion engine (indicated by the arrows).

The present invention thus at least partially solves the problems explained with reference to the prior art. In particular, it indicates a tubular thermoelectric module which can compensate for the differences in thermal expansion of individual components of the thermoelectric module and thus achieves a high level of durability of the thermoelectric module, even during operation. A temperature-stable and durable thermoelectric module has thus been indicated.

The invention claimed is:

1. A thermoelectric module, comprising:
   an outer tube and an inner tube extending in a longitudinal direction and defining circumferential directions, said inner tube disposed within said outer tube forming an interspace therebetween;
   at least one first strip-shaped structure having a first connection to said inner tube and at least one second strip-shaped structure having a second connection to said outer tube;
   said first strip-shaped structure starting from said first connection and said second strip-shaped structure starting from said second connection and extending in mutually opposite directions in at least one of said circumferential directions or said longitudinal direction and at least partially forming an overlap at least in said one circumferential direction or in said longitudinal direction,
   said first strip-shaped structure extending in a direction defining a longest dimension of said first strip-shaped structure, said second strip-shaped structure extending in a direction defining a longest dimension of said second strip-shaped structure;
   said first strip-shaped structure extending from said inner tube toward said outer tube in the direction defining the longest dimension of said first strip-shaped structure, said second strip-shaped structure extending from said outer tube toward said inner tube in the direction defining the longest dimension of said second strip-shaped structure; and
   at least one pair of semiconductor elements disposed at said overlap.

2. The thermoelectric module according to claim 1, wherein said outer tube and said inner tube are configured relative to one another so as to compensate for a thermal expansion of the thermoelectric module by a movement of said outer tube relative to said inner tube.

3. The thermoelectric module according to claim 1, wherein said first connection and said second connection are disposed obliquely relative to said one circumferential direction or to said longitudinal direction.

4. The thermoelectric module according to claim 1, wherein said first connection is one of a plurality of first connections extending in a helical shape on said inner tube and said second connection is one of a plurality of second connections extending in a helical shape on said outer tube.

5. The thermoelectric module according to claim 1, wherein a plurality of said structures is disposed at least in said one circumferential direction or in said longitudinal direction.

6. A method for producing a tubular thermoelectric module, the method comprising producing the tubular thermoelectric module according to claim 1 by performing the following steps:
   a) providing at least one first strip-shaped structure having extending in a direction defining a longest dimension of the first strip-shaped structure and at least one second strip-shaped structure having extending in a direction defining a longest dimension of the second strip-shaped structure;
   b) applying an electrically conductive conductor structure to at least the first strip-shaped structure or the second strip-shaped structure;
   c) applying semiconductor elements to the electrically conductive conductor structure of at least one strip-shaped structure; and
   d) configuring the at least one first strip-shaped structure to extend from the inner tube toward the outer tube in the direction defining the longest dimension of the first strip-shaped structure, configuring the at least one second strip-shaped structure to extend from the inner tube toward the outer tube in the direction defining the longest dimension of the second strip-shaped structure, configuring the at least one first strip-shaped structure and the at least one second strip-shaped structure to form at least one respective pair, forming an overlap of the first strip-shaped structure and the second strip-shaped structure in one region and connecting each of the semiconductor elements to a respective strip-shaped structure by an electrically conductive conductor structure, permitting a flow of current to be produced along each pair of the first and second strip-shaped structures.

7. The method according to claim 6, which further comprises forming at least the inner tube or the outer tube at least partially by the strip-shaped structures in step d).

8. The method according to claim 6, which further comprises applying the semiconductor elements by a printing method.

9. A thermoelectric generator, comprising:
   a plurality of electrically interconnected thermoelectric modules according to claim 1.

10. A thermoelectric generator, comprising:
    a plurality of electrically interconnected thermoelectric modules produced by the method according to claim 6.

11. The thermoelectric module according to claim 1, wherein said first strip-shaped structure has a length defining the longest dimension of said first strip-shaped structure and said second strip-shaped structure has a length defining the longest dimension of said second strip-shaped structure.

12. The method according to claim 6, wherein the first strip-shaped structure has a length defining the longest dimension of the first strip-shaped structure and the second strip-shaped structure has a length defining the longest dimension of the second strip-shaped structure.

* * * * *